(12) United States Patent
Bose et al.

(10) Patent No.: US 7,746,055 B2
(45) Date of Patent: Jun. 29, 2010

(54) CURRENT MEASURING DEVICE

(75) Inventors: Sanjay Bose, Edison, NJ (US); Anthony T. Giuliante, Galloway, NJ (US); Amir Makki, Northfield, NJ (US)

(73) Assignees: Consolidated Edison Company of New York, Inc., New York, NY (US); Softstuf, Inc., Philadelphia, PA (US)

( * ) Notice: Subject to any disclaimer, the term of this patent is extended or adjusted under 35 U.S.C. 154(b) by 34 days.

(21) Appl. No.: 12/249,547

(22) Filed: Oct. 10, 2008

(65) Prior Publication Data

US 2010/0090683 A1    Apr. 15, 2010

(51) Int. Cl.
    *G01R 15/20* (2006.01)
(52) U.S. Cl. .................... 324/117 H; 324/126
(58) Field of Classification Search ............. 324/117 R, 324/117 H, 158.1, 127, 251, 252, 126, 130, 324/132, 142, 765, 96; 338/32 R, 32 H, 49
See application file for complete search history.

(56) References Cited

U.S. PATENT DOCUMENTS

| | | | |
|---|---|---|---|
| 3,219,930 | A | 11/1965 | Sipler |
| 4,059,798 | A | 11/1977 | Dierker et al. |
| 4,425,541 | A | 1/1984 | Burkum et al. |
| 4,540,935 | A | 9/1985 | Burkum et al. |
| 4,704,575 | A | 11/1987 | Arnoux et al. |
| 4,914,383 | A | 4/1990 | Wilkerson |
| 5,426,360 | A | 6/1995 | Maraio et al. |
| 5,493,211 | A | 2/1996 | Baker |
| 6,472,878 | B1 * | 10/2002 | Bruchmann ................ 324/424 |
| 6,586,923 | B2 | 7/2003 | Seike |
| 6,759,840 | B2 * | 7/2004 | Marasch et al. ......... 324/117 H |
| 6,989,665 | B2 | 1/2006 | Goto |
| 7,164,263 | B2 | 1/2007 | Yakymyshyn et al. |
| 7,327,133 | B2 | 2/2008 | Baker |
| 2001/0052765 | A1 | 12/2001 | Seike |
| 2003/0017753 | A1 | 1/2003 | Palmisano et al. |
| 2009/0009175 | A1 | 1/2009 | Semati |

FOREIGN PATENT DOCUMENTS

WO    WO2007091985 A2    8/2007

OTHER PUBLICATIONS

International Search Report and Written Report, International Patent Application PCT/US2009/059498, Mailed Jan. 27, 2010, 11 pages.

* cited by examiner

*Primary Examiner*—Minh N Tang
*Assistant Examiner*—Trung Q Nguyen
(74) *Attorney, Agent, or Firm*—Cantor Colburn LLP

(57) ABSTRACT

A current sensor is provided for non-invasively measuring electrical current in an electrical conductor. The current sensor includes a housing having a Hall effect sensor and circuitry for transmitting a signal indicative of the current flowing through the electrical conductor. The current sensor further includes a clamp that allows an operator to easily and repeatedly install and remove the current sensor from electrical conductors. The current sensor may also include a mu-metal device for shielding the Hall effect sensor for stray magnetic fields generated by adjacent electrical conductors.

20 Claims, 10 Drawing Sheets

CURRENT MEASURING DEVICE

BACKGROUND OF THE INVENTION

The present invention relates generally to a device for the noninvasive measurement of electrical current through a conductor and in particular to a device the has a sensor with a clamping mechanism that holds an electrical conductor against a Hall effect sensor.

Electrical power is typically produced at centralized power production facilities and transferred at high voltages to local substations. The local substations transform the electrical power to a medium or low voltage. The electrical power is subsequently distributed through feeders to local distribution networks. The power is thus delivered to end customer that consumes the electrical power.

Since the electrical power is often transmitted over long distances, reliability and integrity of the system are major considerations in the design of the transmission system. During transmission of the electrical power, a number of different faults may occur due to events such as vegetation growth and lightening strikes for example. A number of control devices are used within the transmission system such as fuses, transformers, circuit breakers, reclosers and protective relays. These devices help control the flow of electrical power and provide functionality for removing electrical power in the event of an electrical fault.

A protective relay is one type device that detects undesirable electrical conditions, such as high voltage for example. The protective relay operates in conjunction with a circuit breaker for interrupting the flow of electrical current when the undesired condition is detected. Protective relays have selectable time/current curves that allow the operator to have a fine level of control over the triggering conditions. One type of protective relay uses elaborate electromechanical components, such as arrays of induction disks or induction cylinders, shaded-pole magnets, operating and restraint coils, solenoid-type operators, and phase-shifting networks to allow the relay to respond to such conditions as over-current, over-voltage, reverse power flow, over-frequency and under-frequency. Protective relays may even be arranged to provide trip functionality for faults up to a certain distance away from a substation but not beyond that point by measuring the apparent impedance.

When a fault occurs, the electromechanical type protective relay provides a signal to the circuit breaker to interrupt the current flow. An indicator, such as a visual flag, is then displayed on the relay to indicate the detection of the undesired condition. To restore service, repair personnel need to physically visit the substation where the relays are located and determine which protective relay operated. As a substation having many protective relays may cover a wide geographic area, the process of physically identifying the relay may be time consuming and costly.

Accordingly, while existing systems and methods for determining the operation of protective relays are suitable for their intended purposes, there still remains a need for improvements particularly regarding the coupling of sensors to electromechanical relays to allow remote detection of protective relay operation.

SUMMARY OF THE INVENTION

A current measuring device is provided having a base with a generally hollow interior portion. A cover is coupled to the base. An arm is coupled to the cover. A clamp is coupled to the arm, the clamp having a first semi-circular recess on one side of the arm and a lever portion on a side of the clamp opposite the first semi-circular recess. A semi-circular mu-metal member is coupled to the first semi-circular recess. A Hall effect sensor is coupled to the base adjacent the first semi-circular recess.

A removable current sensor is also provided having a housing. A clamp is coupled to the housing, the clamp having a locking portion on one end and a lever arm on an opposite end. The clamp is also rotatable between a first position wherein the locking portion is in contact with the housing, and a second position. A Hall effect sensor having a first end is mounted to the housing, the Hall effect sensor further includes a second end positioned adjacent the clamp locking portion. A biasing member is coupled between the housing and the lever arm, the biasing member is arranged to rotate the clamp locking portion towards the Hall effect sensor.7

A current sensor for measuring electrical current flow through an electrical conductor is also provided. The current sensor includes a clamp member. The clamp member has a lever arm on one end and a first recess on an opposite end. The first recess being sized to receive the electrical conductor. A pivot arm is rotatably coupled to the clamp member between the lever arm and the recess. A housing is coupled to the pivot arm, the housing includes a hollow interior portion and an opening adjacent the first recess. A Hall effect sensor is positioned within the opening and mounted on one end to the housing within the hollow interior. A mu-metal insert is coupled to said first recess. The mu-metal insert is sized to receive the electrical conductor.

BRIEF DESCRIPTION OF THE DRAWINGS

Referring now to the drawings, which are meant to be exemplary and not limiting, and wherein like elements are numbered alike.

DETAILED DESCRIPTION

Figure 1:
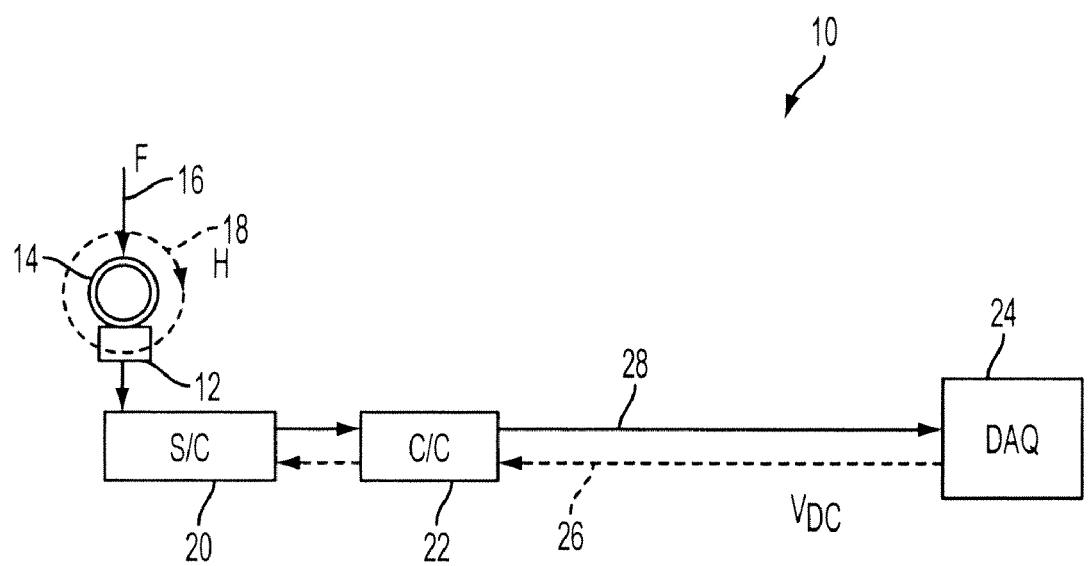
FIG. 1 is a schematic illustration of a current sensor in accordance with an exemplary embodiment

FIG. 1 illustrates an exemplary embodiment of a current sensor device 10. The current sensor 10 includes a Hall effect device 12 that is placed in contact with an electrical conductor 14 by a clamping force (F) 16. In the exemplary embodiment, the Hall effect device 12 is an integrated circuit that includes a transducer that varies its output voltage in response to changes in a magnetic field. When electrical current passes through the electrical conductor 14, a magnetic field (H) 18 is created. In response to the magnetic field 18, the Hall effect sensor produces an electrical signal that is proportional to the magnetic field 18 and the electrical current flowing through the electrical conductor 14. In a typical application, such as with protective relays for example, Hall effect sensor 12 is capable of sensing a current between 0.2 to 40.0 amps passing through electrical conductor 14.

A current sensing circuit 20 is electrically coupled to receive a signal from the Hall effect sensor 12. It should be appreciated that the sensing circuit 20 may be integrated as a single package with the integrated circuit of the Hall effect sensor 12. The sensing circuit 20 transmits a signal indicative of the current flowing through electrical conductor 14 to a signal conditioning circuit 22. The conditioning circuit modifies the signal from the sensing circuit 20, such as through amplification for example, and prepares the signal for transmission to a data acquisition system 24. In the exemplary embodiment, the signal is transmitted between the conditioning circuit 22 and the data acquisition system 24 over a data transmission medium 28 that carries both power and data. Alternatively, the electrical power needed for operation of the current sensor 20 may be supplied via a separate conductor 26 either from the data acquisition system 24 or from a separate power supply (not shown). Data transmission media 28 includes, but is not limited to, twisted pair wiring, coaxial cable, and fiber optic cable. Data transmission media 28 also includes, but is not limited to, wireless, radio and infrared signal transmission systems.

The data acquisition system 24 may be a dedicated acquisition system, or alternatively may be a general-purpose computer having executable software for receiving signals from the current sensor 10. As such, the data acquisition system 24 may be microprocessor, microcomputer, a minicomputer, an optical computer, a board computer, a complex instruction set computer, an ASIC (application specific integrated circuit), a reduced instruction set computer, an analog computer, a digital computer, a molecular computer, a quantum computer, a cellular computer, a superconducting computer, a supercomputer, a solid-state computer, a single-board computer, a buffered computer, a computer network, a desktop computer, a laptop computer, or a hybrid of any of the foregoing.

Data acquisition system 24 is capable of converting the analog voltage or current level provided by current sensor 10 into a digital signal indicative of the level of the amount of electrical power flowing through conductor 14. Alternatively, current sensor 10 may be configured to provide a digital signal to data acquisition system 24, or an analog-to-digital (A/D) converter (not shown) maybe coupled between current sensor 10 and data acquisition system 24 to convert the analog signal provided by current sensor 10 into a digital signal for processing by data acquisition system 24. It should be further appreciated that additional components and circuits (not shown) may be arranged between the current sensor 10 and the data acquisition system 24 without deviating from the intended scope of the claimed invention.

Figure 2:
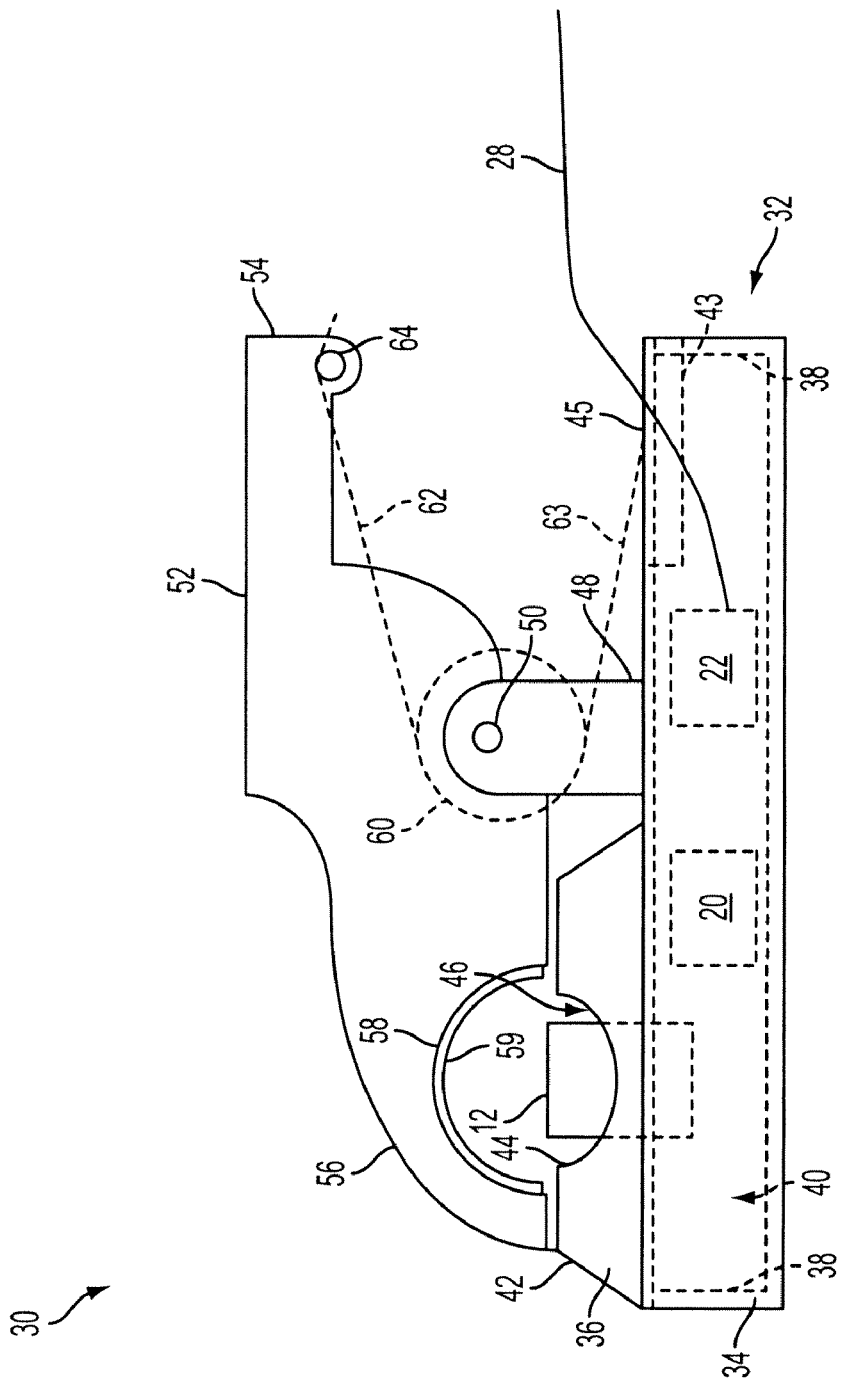
FIG. 2 is a side plan view illustration of another embodiment current sensor.

Another embodiment current sensor 30 is illustrated in FIG. 2. In this embodiment, the current sensor 30 has a housing 32 with a base 34 and a cover 36. In the exemplary embodiment, the cover 36 couples to the base 34 by a snap fit. The cover 36 may also couple to the base 34 by other methods known in the art, such as mechanical fasteners, screws, or bonded with an adhesive for example. The base 34 and cover 36 are made from a nonconductive plastic material such as polypropylene, polyethylene or polycarbonate for example.

The base 34 has walls 38 that form a generally hollow interior portion 40. The interior portion 40 may include pockets (not shown) that are integrally formed in the base 34. The pockets may be used to mount components, such as Hall effect sensor 12, current sensor circuit 20 or signal conditioning circuit 22 for example, as is known in the art. The cover 36 includes a raised portion 42 having a semi-circular recess 44. An opening 46 in the recess 44 allows the Hall effect sensor 12 to be mounted inside the base 34 and extend past the surface of the recess 44. On an end opposite the raised portion 42, a slot 43 is formed in the top surface 45 of cover 36. The slot 43 is sized to receive a cable from transmission medium 28. The use of the slot 43 in the cover 36 allows the thickness of the base 34 to be reduced and thus minimizing the amount of space required for installation of the current sensor 30. It should be appreciated that openings for the transmission medium cable may also be located in the base 34 such as in the walls 38 for example.

An arm 48 extends past the top surface 45 of the cover 36 adjacent the raised portion 42. The arm 48 may be formed in the cover 36, the base 34 or be formed as a separate component and mounted to either the cover 36 or the base 34. The arm 48 extends past the top surface of the raised portion 42 and includes a hole sized to receive a pin 50. As will be discussed in more detail below, the pin 50 provides a pivot to allow rotation of a clamp 52. It should be appreciated that while only one arm 48 is illustrated, in one embodiment, there are two arms 48 arranged on either side of the clamp 52.

The clamp 52 is rotatably coupled to the housing 32 by the pin 50. In the exemplary embodiment, the clamp 52 is made from a nonconductive plastic material and may be made from the same material as the housing 32. The clamp 52 includes a lever portion 54 on one end and a locking portion 56 on an opposite end. The locking portion includes a recess 58 adjacent the raised portion 42. The recess 58 is sized to receive a mu-metal device 59. The mu-metal device 59 is a thin walled member that extends the width of the clamp 52. The mu-metal device 59 may be coupled in the recess 58 such as by insert molding or by bonding for example. A mu-metal is typically a nickel-iron alloy (75% nickel, 15% iron, plus copper and molybdenum) that has very high magnetic permeability. As will be discussed in more detail below, the high permeability makes the mu-metal device 59 effective at screening static or low frequency magnetic fields.

A biasing member 60, such as a spring for example, is captured on the pin 50. In the exemplary embodiment, the biasing member 60 is a torsion spring having a first arm 62 coupled to the lever portion 54 by a pin 64. A second arm 63 extends from the biasing member 60 and contacts the top surface 45. The biasing member 60 is arranged to bias the clamp 52 such that the recess 58 rotates toward the raised portion 42.

Figure 3:
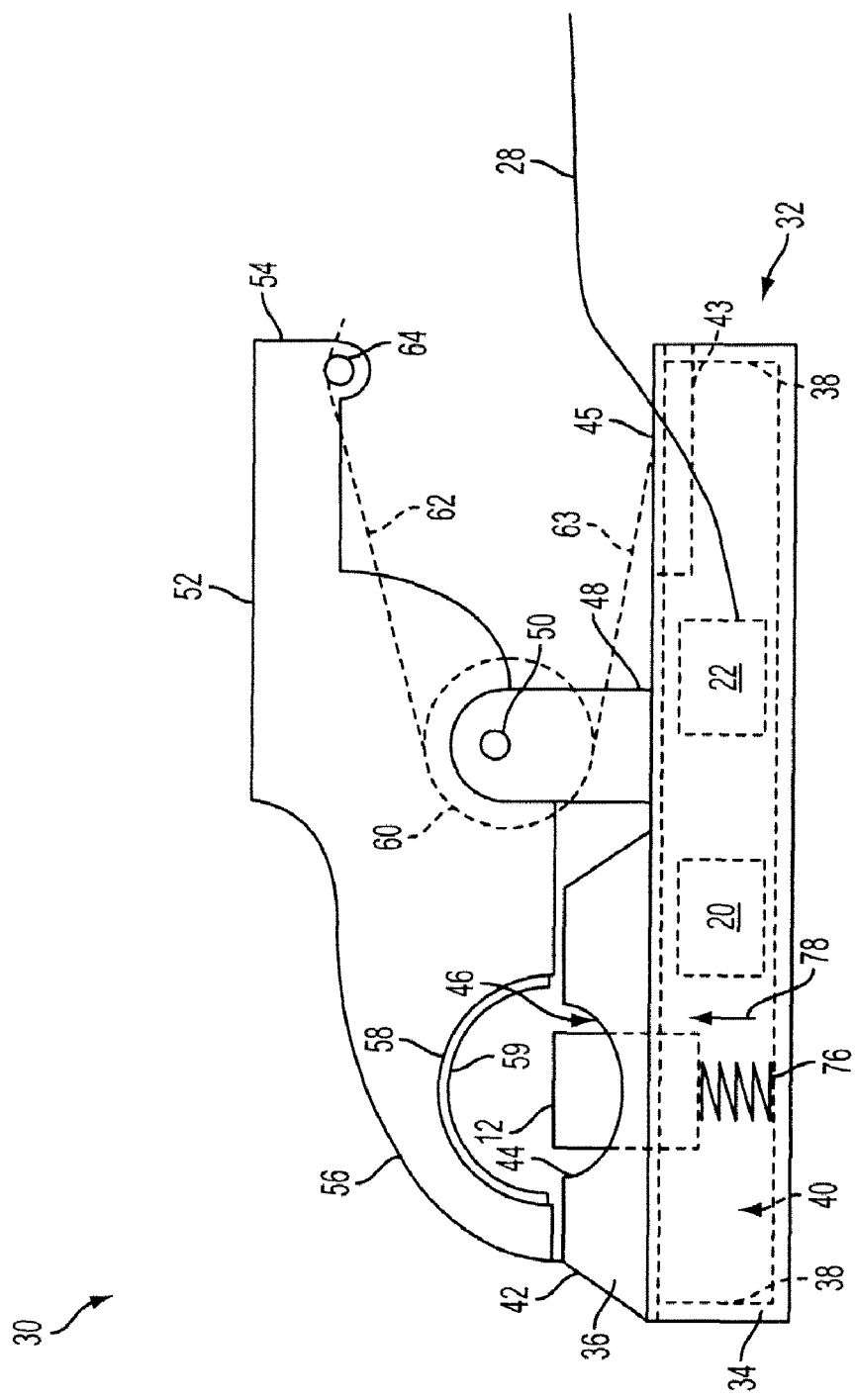
FIG. 3 is a side plan view illustration of another embodiment current sensor having a Hall effect sensor mounted to a biasing member.

It should be appreciated that it is desirable to have the current sensor 30 accommodate as a wide range of electrical conductor sizes. Referring now to FIG. 3, another embodiment of current sensor 30 is illustrated. In this embodiment, the Hall effect sensor 12 is not mounted directly to the base 34, but rather is mounted to a biasing member 76. The biasing member 76 couples to Hall effect sensor 12 to the base 34 and provides a biasing force in the direction of arrow 78. The biasing member 76 is an elastically compliant member that allows the Hall effect sensor 12 to move relative to the base and the recessed area 44. As such, the biasing member 76 may be a spring such as a compression spring for example. The use of the biasing member 76 allows the top surface of the Hall effect sensor 12 to move in response to the diameter of the electrical conductor. For example, when the current sensor 30 is coupled to an electrical conductor having a larger diameter, the biasing member 76 compresses allowing the electrical conductor to seat within the recessed area 44 with the Hall effect sensor 12 remaining in contact with the conductor. Thus the biasing member 76 provides advantages in allowing the Hall effect sensor to securely contact a range of electrical conductor diameters.

Figure 4:
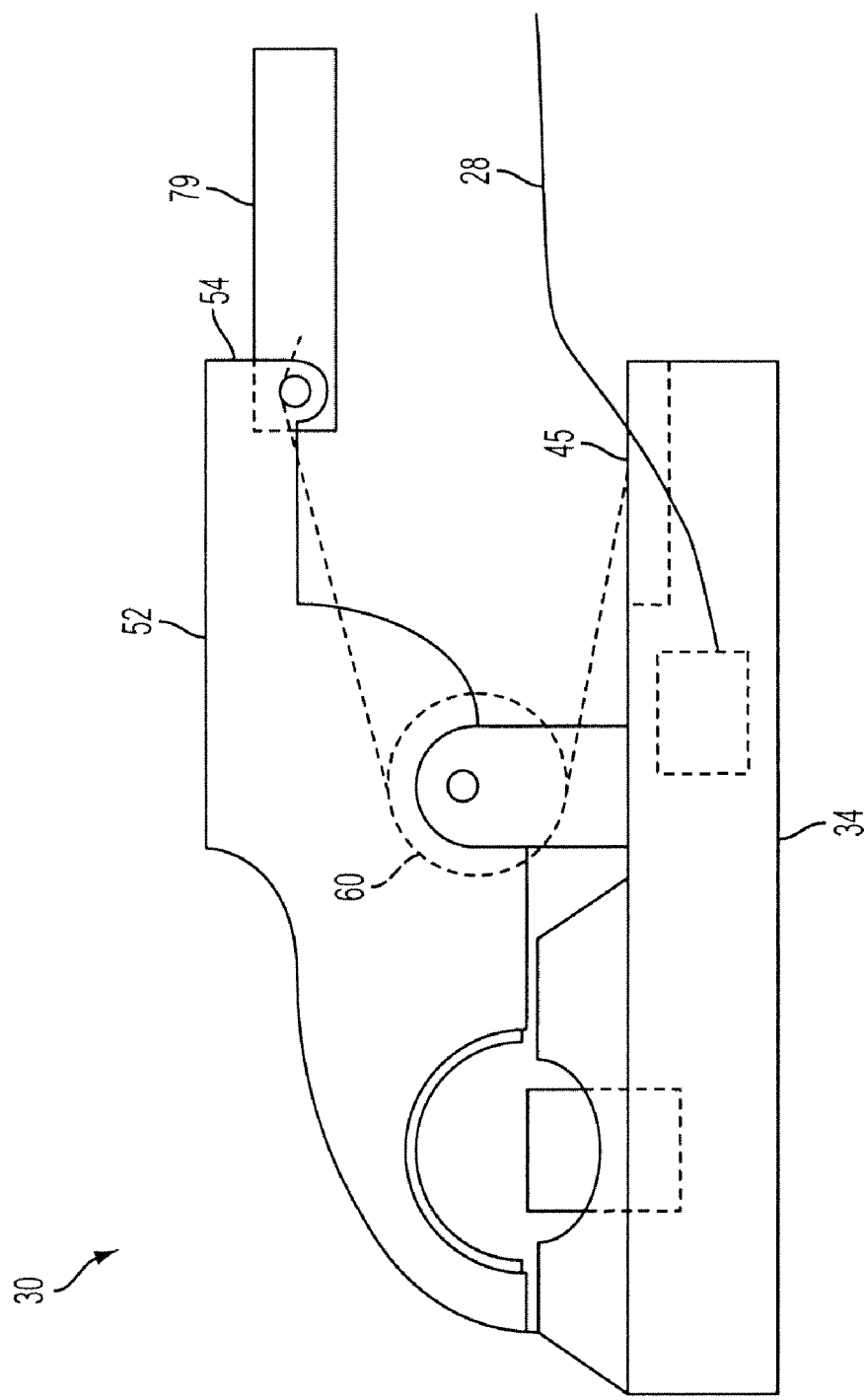
FIG. 4 is a side plan view illustration of another embodiment current sensor having a fastening arrangement.
Figure 5:
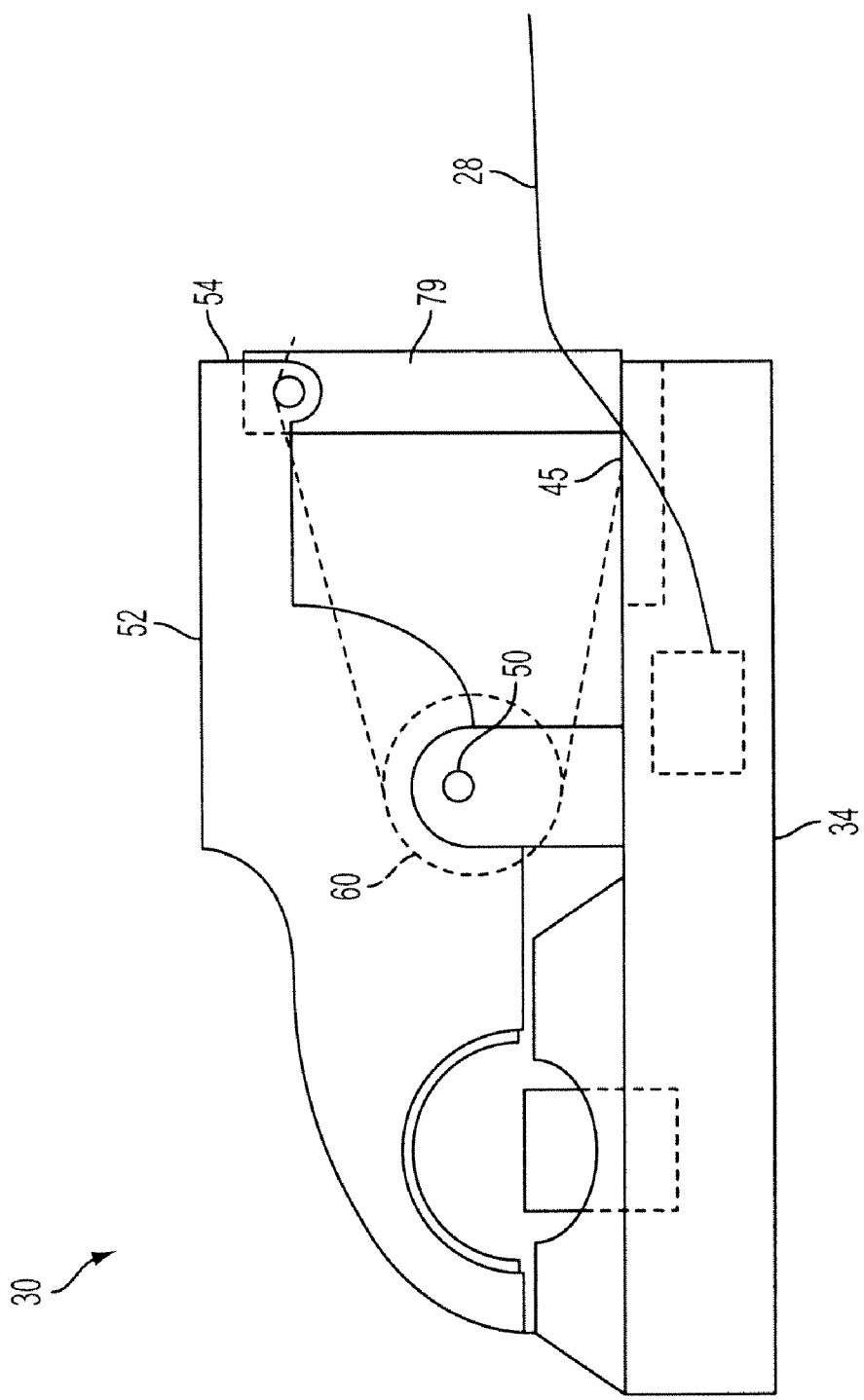
FIG. 5 is a side plan view illustration of the current sensor of FIG. 4 in the locked position

It should further be appreciated that in some environments, such as applications where the current sensor 30 will be subject to vibrations for example, it may be desirable provide an additional means of retaining the clamp 52 against the electrical conductor to prevent inadvertent disconnection. In one embodiment illustrated in FIG. 4 and FIG. 5, a dial or locking clip 79 is coupled to the pin 64. Once the operator attaches the current sensor 30 to a conductor, the locking clip 79 is rotated about the pin 64 from the open position (FIG. 4) to the locked position (FIG. 5). When in the locked position, the locking clip 79 is in contact with the top surface of the base 34. Thus, the lever portion 54 is prevented from rotation about the pin 50 and the clamp 52 cannot be opened.

Figure 6:
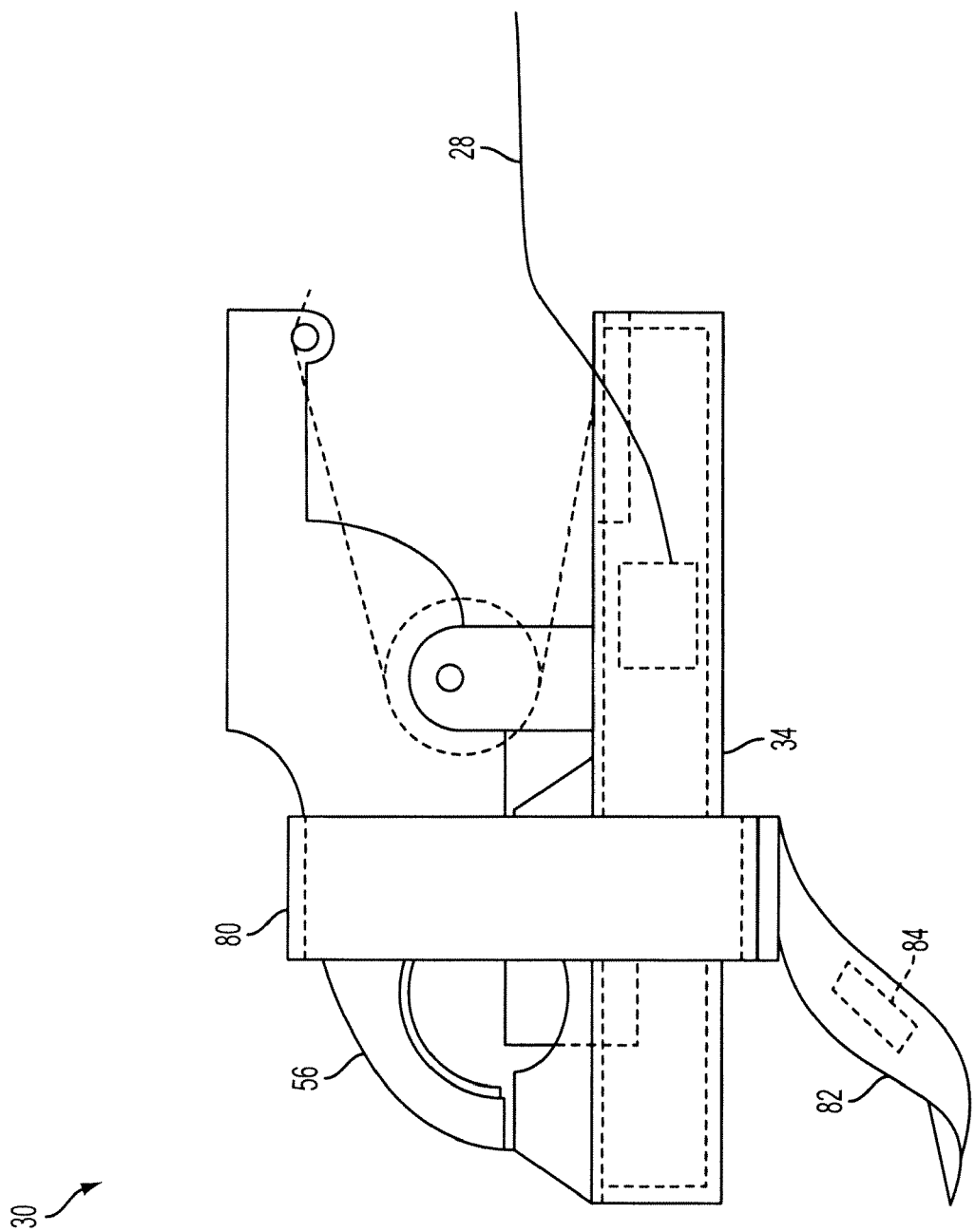
FIG. 6 is a side plan view illustration of another embodiment current sensor having a fastening arrangement.

In another embodiment, illustrated in FIG. 6, a flexible strip 80 having a hook-and-loop type fastener is wrapped around the base 34 and locking portion 56. The use of the hook-and-loop fastener allows the flexible strip 80 to accommodate a variety of electrical conductor sizes. Flexible strip 80 may also include a tag portion 82 that provides a writing area 84. The operator to identify the electrical conductor being monitored may use the writing area 84.

Figure 7:
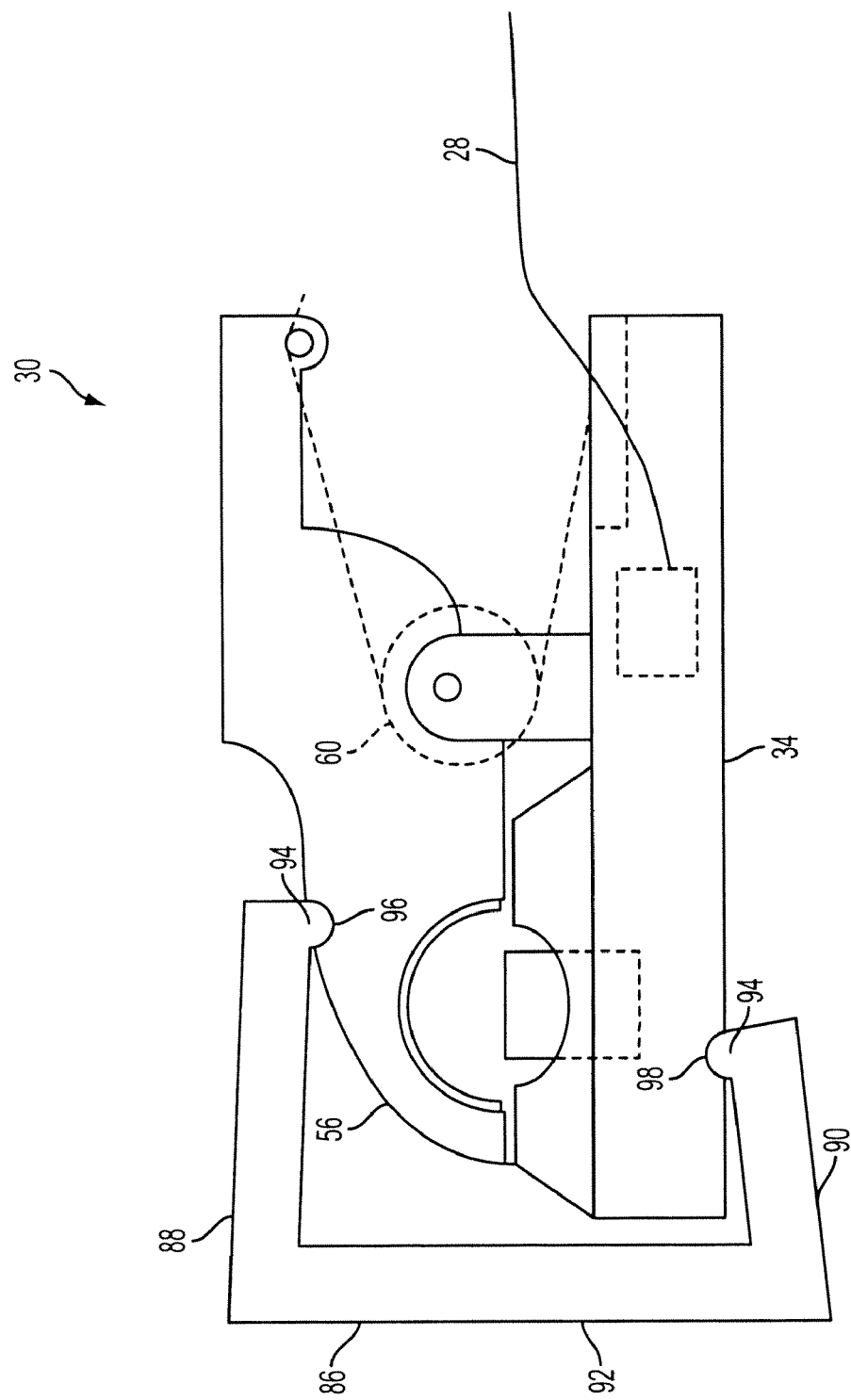
FIG. 7 is a side plan view illustration of another embodiment current sensor having another fastening arrangement.

In yet another embodiment, a clip type fastener 86 may be used as illustrated in FIG. 7. In this embodiment, a "C" type clip fastener 86 has a first arm 88 and a second arm 90 that extend from a body portion 92. The clip fastener 86 is made from a flexible material that allows the arms 88, 90 to elastically deform when the clip fastener 86 is pushed onto the current sensor 30. At the end of each arm 88, 90 is a projection 94 that slides into a groove 96, 98 in the locking portion 56 and the base 34 respectively. The elasticity of the clip fastener 86 retains the projections 94 in contact with grooves 96, 98 and prevents the locking portion 56 from inadvertently opening during operation. In another embodiment, the clip fastener second arm 90 is coupled to the base 34 by a hinge. To secure the current sensor 30, the clip fastener 86 is rotated about the hinge until the projection 94 on first arm 88 contacts the groove 96.

Figure 8:
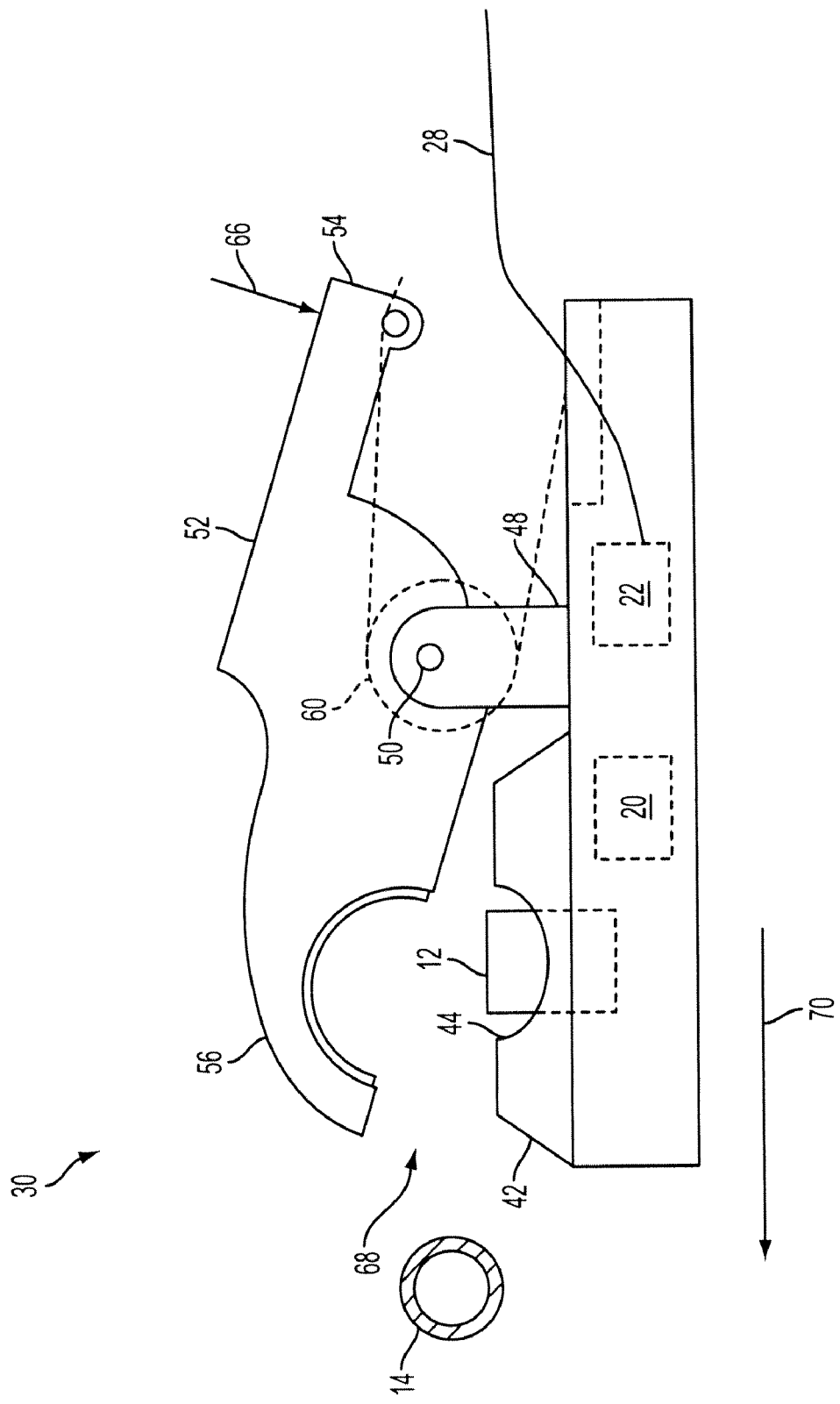
FIG. 8 is a side plan view illustration of the current sensor of FIG. 2 in an open position.
Figure 9:
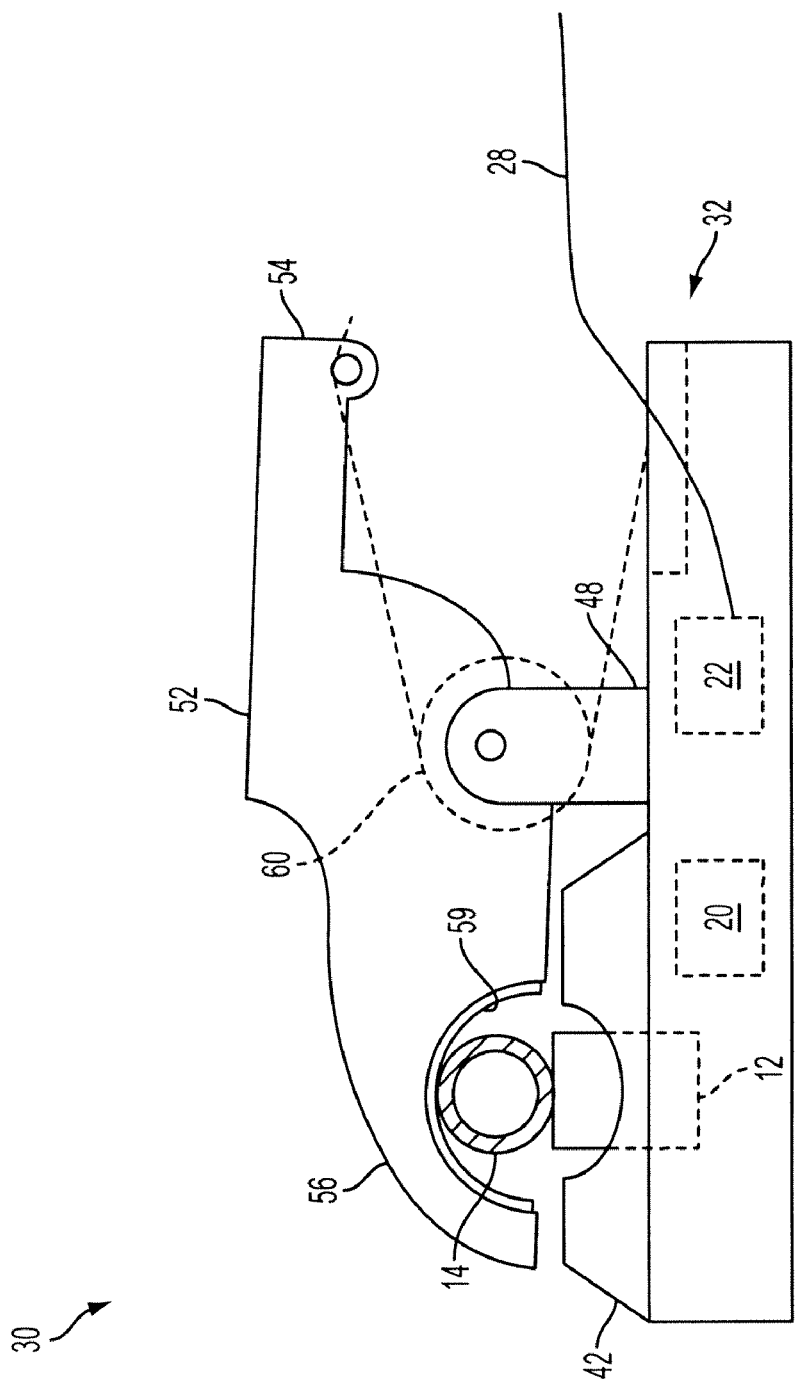
FIG. 9 is a side plan view illustration of the current sensor of FIG. 2 coupled to an electrical conductor; and, FIG. 10 is a side plan view illustration of an alternate embodiment current sensor having wireless connectivity.

Turning now to FIG. 8 and FIG. 9, the installation and operation of the current sensor 30 will be described. To install the current sensor 30, the operator applies a force, as represented by arrow 66. The operator may squeeze the current sensor 30 between their thumb and index fingers, similar to a clothespin for example, to apply the force 66. Once sufficient force 66 is applied to overcome the resistance of biasing member 60, the clamp 52 rotates about the pin 50. This rotation creates a gap 68 between the raised portion 42 and the bottom surface of the clamp 52. The current sensor 30 is then moved in the direction represented by arrow 70 until the electrical conductor 14 is adjacent the Hall effect sensor 12.

Once the electrical conductor 14 is adjacent the Hall effect sensor 12, the force 66 is removed and the clamp locking portion 56 and recess 58 rotate in the opposite direction under the influence of biasing member 60. The rotation continues until the mu-metal device 59 contacts the electrical conductor 14. It should be appreciated that the clamping force created by the biasing member 60 is of sufficient level to maintain the current sensor 30 in the desired position during operation.

With the current sensor 30 clamped on electrical conductor 14, the Hall effect sensor 12 is positioned within the influence of magnetic fields generated by electrical current flowing through the electrical conductor 14. Since the mu-metal device 59 substantially surrounds the conductor 14 in the area of the Hall effect sensor 12, any magnetic field detected by the Hall effect sensor 12 should be from the conductor 14 and not due to magnetic fields from surrounding or adjacent conductors and other electrical devices. Therefore, once electrical current flows through conductor 14, Hall effect sensor 12 will generate a signal that is then processed by current sensing circuit 20 and signal conditioning circuit 22 before being transmitted by transmission media 28. To remove the current sensor 30, the operator once again applies the force 66 to the lever portion 54 and reverses the process. Thus, the current sensor 30 may be easily and repeatedly installed on electrical conductors.

Figure 10:
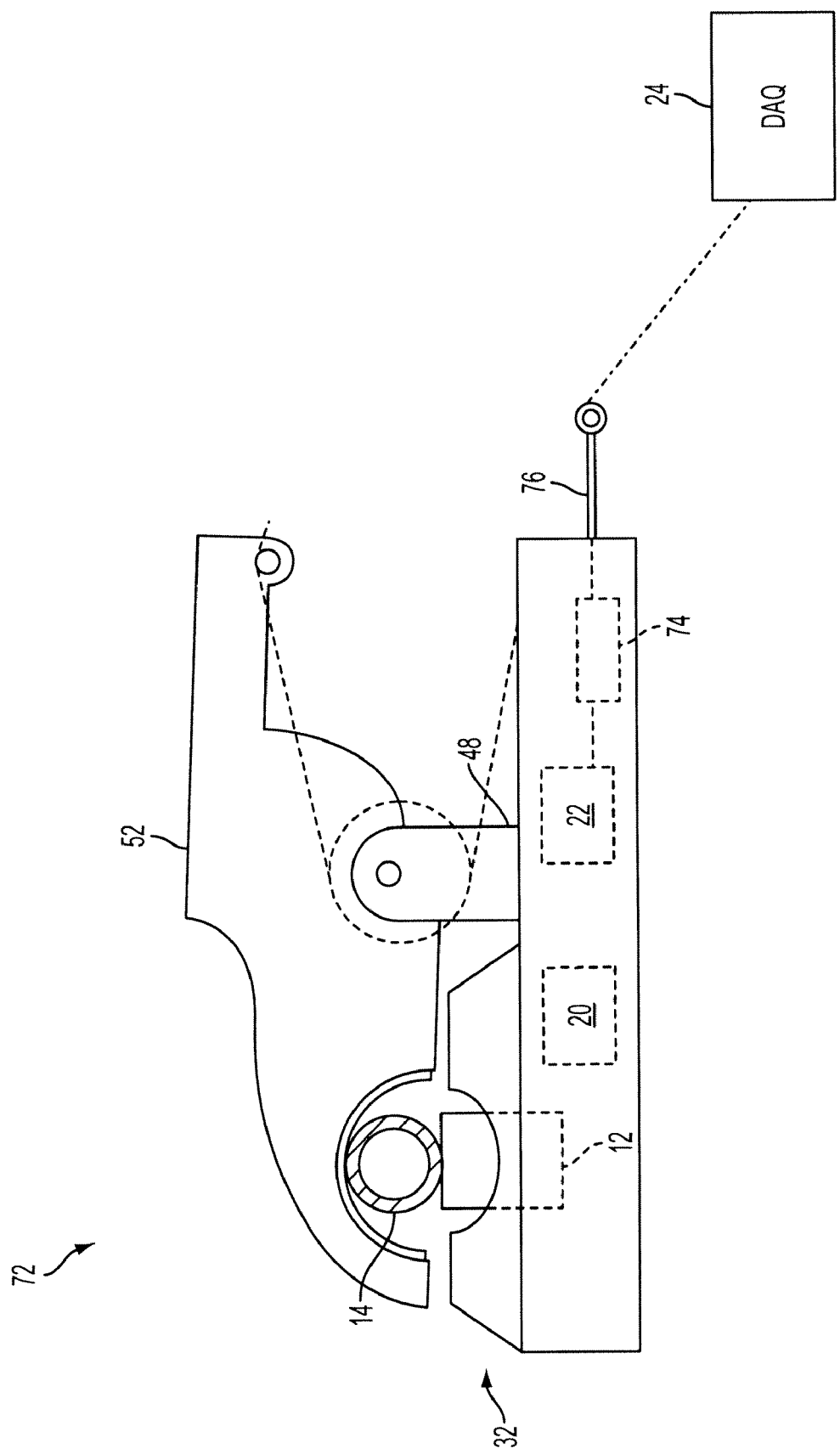

Another embodiment current sensor 72 is illustrated in FIG. 10. This embodiment is similar to those described above with respect to FIG. 2. In this embodiment, an additional communications circuit 74 is coupled to the output of signal conditioning circuit 22. The communications circuit 74 is coupled to an antenna 76. The antenna 76 transmits the signal wirelessly with electromagnetic radiation to data acquisition system 24. As such, communications circuit 74 may transmit the signal using cellular, GSM, radio, infrared light, laser light or acoustic energy. The communications circuit 74 may further comply with a variety of standards including but not limited to IEEE 802.11, IEEE 802.16, bluetooth, wireless universal serial bus, dedicated short range communications (DSRC) and communications, air-interface, long and medium range (CALM).

It should be appreciated that the antenna 76 may be integrated with the communications circuit 74, or alternatively positioned within the interior portion 40. The use of a wireless connection provides an advantage in facilitating the installation of the current sensor 72 in equipment cabinets, such as where protective relays are located for example. This avoids the need to route cables or drill pass-through openings to allow the cable to exit the cabinet.

Electrical power for operating the wireless current sensor 72 may be provided by a self-powering current sensor. A self-powering current sensor, such as a current transformer for example, generates electricity in proportion to electrical current flowing through its windings. Alternatively, the electrical power may be provided by a power source such as a battery for example. In one embodiment, the battery is arranged in a clip fastener, such as the clip fastener 86 described in reference to FIG. 7.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A current measuring device comprising:

a base having a generally hollow interior portion;

a cover coupled to said base;

an arm coupled to said cover;

a clamp coupled to said arm, said clamp having a first semi-circular recess on one side of said arm and a lever portion on a side of said clamp opposite said first semi-circular recess;

a semi-circular mu-metal member coupled to said first semi-circular recess; and, a Hall effect sensor coupled to said base adjacent said first semi-circular recess.

2. The current measuring device of claim 1 wherein said cover includes a second semi-circular recess adjacent said first semi-circular recess, said second semi-circular recess having an opening therein, wherein a portion of said Hall effect sensor is positioned within said opening.

3. The current measuring device of claim 2 further comprising a spring coupled between said cover and said lever portion, said spring arranged bias an end of said clamp adjacent to said first semi-circular recess towards said cover.

4. The current measuring device of claim 3 wherein said spring is a torsion spring coupled said arm.

5. The current measuring device of claim 4 further comprising:
a current sensing circuit electrically coupled to said Hall effect sensor; and,
a signal conditioning circuit electrically coupled to said signal sensing circuit.

6. The current measuring device of claim 5 further comprising a communications circuit electrically coupled to said signal conditioning circuit.

7. The current measuring device of claim 6 wherein said communications circuit includes an antenna, wherein said antenna is arranged to wirelessly transmit a signal generated by said signal conditioning circuit.

8. A removable current sensor comprising:
a housing;
a clamp coupled to said housing, said clamp having a locking portion on one end and a lever arm on an opposite end, said clamp being rotatable between a first position wherein said locking portion is in contact with said housing, and a second position;
a Hall effect sensor having a first end mounted to said housing, said Hall effect sensor further having a second end positioned adjacent said clamp locking portion; and,
a biasing member coupled between said housing and said lever arm, said biasing member being arranged to rotate said clamp locking portion towards said Hall effect sensor.

9. The removable current sensor of claim 8 further comprising:
a current sensing circuit mounted within said housing and electrically coupled to said Hall effect sensor; and
a signal conditioning circuit mounted within said housing and electrically coupled to said current sensing circuit, said signal conditioning circuit including a connector.

10. The removable current sensor of claim 9 wherein said housing includes a slot adjacent said lever arm, said slot being sized to receive a cable that couples to said connector.

11. The removable current sensor of claim 10 wherein said locking portion includes a first recess adjacent said Hall effect sensor.

12. The removable current sensor of claim 11 further comprising a mu-metal insert coupled to said locking portion between said first recess and said Hall effect sensor.

13. The removable current sensor of claim 12 wherein said housing includes a second recess adjacent said mu-metal insert, wherein said Hall effect sensor is positioned within said second recess.

14. The removable current sensor of claim 13 further comprises a communications circuit having an antenna, said communications circuit being mounted within said housing and being electrically coupled to said signal conditioning circuit.

15. A current sensor for measuring electrical current flow through an electrical conductor, said current sensor comprising:
a clamp member, said clamp member having a lever arm on one end and a first recess on an opposite end, said first recess being sized to receive said electrical conductor;
a pivot arm rotatably coupled to said clamp member between said lever arm and said recess;
a housing coupled to said pivot arm, said housing having a hollow interior portion and an opening adjacent said first recess;
a Hall effect sensor positioned within said opening and mounted on one end to said housing within said hollow interior; and,
a mu-metal insert coupled to said first recess, said mu-metal insert being sized to receive said electrical conductor.

16. The current sensor of claim 15 further comprising a torsion spring coupled to said pivot arm, said torsion spring arranged to bias said first recess towards said Hall effect sensor.

17. The current sensor of claim 16 wherein said housing includes a cover adjacent said clamp member, said cover further having a raised portion adjacent said first recess.

18. The current sensor of claim 17 wherein said cover includes a second recess in said raised portion, wherein said opening is positioned within said second recess.

19. The current sensor of claim 18 further comprising:
a current sensing circuit mounted within said hollow interior and electrically coupled to said Hall effect sensor; and,
a signal conditioning circuit mounted within said hollow interior and electrically coupled to said current sensing circuit, said signal conditioning circuit further having a connector.

20. The current sensor of claim 18 wherein said cover includes a slot sized to receive a cable that couples to said connector.

* * * * *